United States Patent
Ramsbey et al.

(10) Patent No.: US 6,500,713 B1
(45) Date of Patent: Dec. 31, 2002

(54) METHOD FOR REPAIRING DAMAGE TO CHARGE TRAPPING DIELECTRIC LAYER FROM BIT LINE IMPLANTATION

(75) Inventors: Mark T. Ramsbey, Sunnyvale, CA (US); Nicholas H. Tripsas, San Jose, CA (US); Arvind Halliyal, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/023,349

(22) Filed: Dec. 20, 2001

(51) Int. Cl.[7] .............................................. H01L 21/336
(52) U.S. Cl. ...................... 438/258; 438/637; 438/259
(58) Field of Search .................. 438/257, 258–261, 438/305–308, 444, 448, 785, 762; 257/288, 299, 390–392

(56) References Cited

U.S. PATENT DOCUMENTS

| | | | |
|---|---|---|---|
| 4,181,538 A | * 1/1980 | Narayan et al. | 148/1.5 |
| 6,297,096 B1 | 10/2001 | Boaz | |
| 6,346,442 B1 | * 2/2002 | Aloni et al. | 438/258 |
| 6,361,874 B1 | * 3/2002 | Yu | 428/514 |

* cited by examiner

Primary Examiner—David Nelms
Assistant Examiner—Dung Anh Le

(57) ABSTRACT

A method of forming a buried bit in line in MONOS cell implants dopant into a substrate through a charge trapping dielectric layer, such as an oxide-nitride-oxide (ONO) layer. The implantation process damages the ONO layer. A laser thermal annealing process repairs the damage to the ONO layer, so that leakage between the buried bit line formed during the implantation process and a control gate formed after the laser thermal annealing is complete is avoided.

15 Claims, 3 Drawing Sheets

US 6,500,713 B1

METHOD FOR REPAIRING DAMAGE TO CHARGE TRAPPING DIELECTRIC LAYER FROM BIT LINE IMPLANTATION

FIELD OF THE INVENTION

The present invention relates to the field of semiconductor manufacture, and more particularly, to the formation of metal oxide nitride oxide (MONOS) cells.

BACKGROUND OF THE INVENTION

FIG. 1, to which reference is made, illustrates a typical prior art MONOS cell. This cell includes a substrate 10 in which are implanted a data source 12 and a drain 14 and on top of which lies an oxide-nitride-oxide (ONO) structure 16 having a layer of nitride 17 sandwiched between two oxide layers 18 and 20. On top of the ONO structure 16 lies a gate conductor 22. Between source 12 and drain 14 is a channel 15 formed under the ONO structure 16. Nitride section 17 provides the charge retention mechanism for programming the memory cell. Specifically, when programming voltages are provided to source 12, drain 14 and gate conductor 22, electrons flow toward drain 14. According to the hot electron injection phenomenon, some hot electrons penetrate through the lower section of silicon oxide 18, especially if section 18 is thin, and are then collected in nitride section 17. As is known in the art, nitride section 17 retains the received charge labeled 24, in a concentrated area adjacent drain 14. Concentrated charge 24 significantly raises the threshold of the portion of the channel of the memory cell under charge 24 to be higher than the threshold of the remaining portion of the channel 15.

When concentrated charge 24 is present (i.e., the cell is programmed), the raised threshold of the cell does not permit the cell to be placed into a conductive state during reading of the cell. If concentrated charge 24 is not present, the read voltage on gate conductor 22 can overcome a much lower threshold and accordingly, channel 15 becomes inverted and hence, conductive.

One of the problems in such a MONOS cell produced by the methodology of the prior art is the damage done to the ONO region during the bit line implantation. As depicted in FIG. 2, a bit line 26 has been formed in the substrate 10 by implantation of dopants through the ONO structure 16. The dopants, such as arsenic, may be implanted prior to the formation of a control gate layer 28 over the ONO structure 16.

The implantation procedure creates a damaged area 30 in the ONO structure 16. The damaged ONO structure immediately above the buried bit line 26 causes leakage between the buried bit line 26 and the control gate 28, which acts as the word line. A conventional thermal anneal may be attempted in order to repair the implantation damage, but such thermal anneals typically require preclean steps which add to the expense of manufacture. Also, such a thermal annealing process will drive the arsenic bit line implant undesirably.

SUMMARY OF THE INVENTION

There is a need for a method of repairing the damage caused by arsenic bit line implants during the creation of MONOS devices, in a manner that avoids extra precleaning steps and undesirable driving of the arsenic bit line implants.

These and other needs are met by embodiments of the present invention which provide a method of forming a MONOS device, comprising the steps of forming a charge trapping dielectric layer, such as an oxide-nitride-oxide (ONO) layer on a substrate, and implanting dopants into the substrate to form a bit line in the substrate. The charge trapping dielectric layer over the bit line is laser thermal annealed, followed by forming a control gate over the charge trapping dielectric layer.

The use of laser thermal annealing provides a precision process to anneal the charge trapping dielectric layer and repair the damage caused by the bit line implant. This is accomplished without thermal cycles that drive the arsenic bit line implant, and also do not require precleaning steps.

The other stated needs are also met by embodiments of the present invention which provide a method of creating a semiconductor device with a buried bit line, and comprises the steps of forming a charge trapping dielectric layer on a substrate, and forming a buried bit line by implanting dopants through the charge trapping dielectric layer into the substrate, thereby damaging the charge trapping dielectric layer. The damage to the charge trapping dielectric layer is repaired by a laser thermal annealing of the charge trapping dielectric layer.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the formation of a MONOS device caused by the creation of a buried bit line in the substrate of the MONOS device. More particularly, the present invention addresses and repairs the damage to a charge trapping dielectric layer, such as an ONO layer, over the bit line in an efficacious manner by the use of laser thermal annealing.

Figure 3:
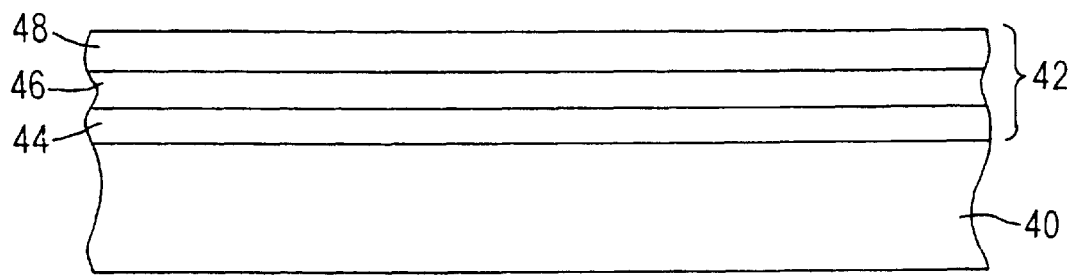
FIG. 3 is a side, cross-section of a substrate in which an ONO layer has been deposited in accordance with embodiments of the present invention.

FIG. 3 is a depiction of a portion of a semiconductor chip having a silicon substrate 40 that may be doped P-type, for example. On top of the substrate 40 is a charge trapping dielectric layer 42. In the exemplary embodiment described below, the charge trapping dielectric layer is an ONO layer, and will be described as such hereafter. In other embodiments of the invention, however, other types of charge trapping dielectric layers known to those skilled in the art may be employed, such as a stack comprising oxide/silicon oxynitride/oxide. In the illustrated embodiment, ONO layer 42 may be formed in a conventional manner. For example, a tunnel oxide layer 44 may be grown on the substrate 40. This is followed by deposition of a nitride layer 46 and steam oxidizing to form a top oxide layer 48. Alternatively, as known to those of skill in the art, the top oxide layer 48 can be deposited instead of being formed by steam oxidization. Any other conventional method of forming ONO 42 may also be employed.

Figure 4:
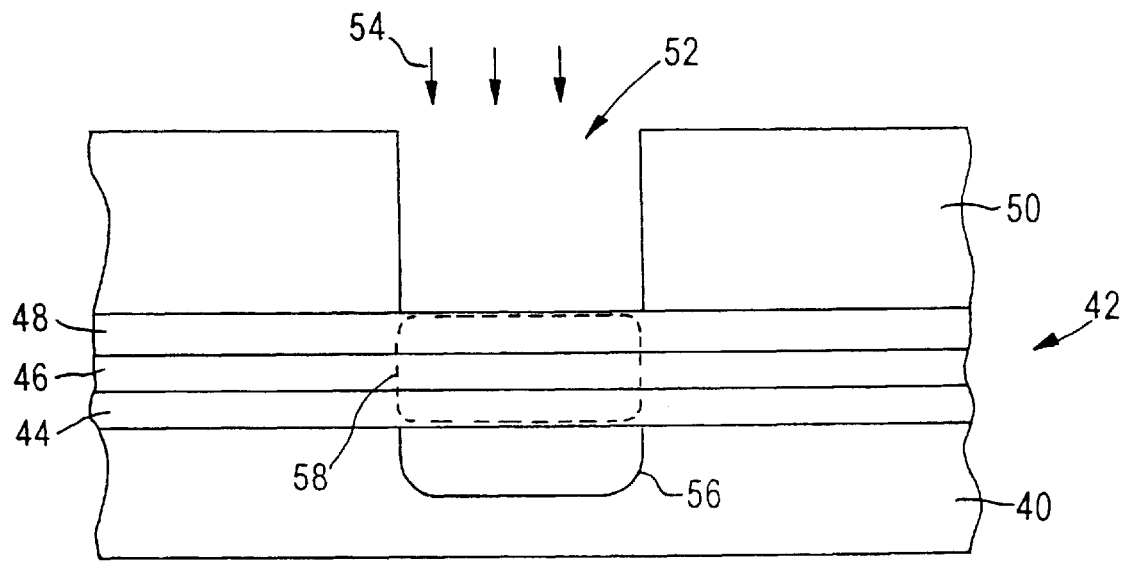
FIG. 4 shows the structure of FIG. 3 following the masking and implantation of dopants to form a buried bit line in the substrate, in accordance with embodiments of the present invention.

FIG. 4 shows the structure of FIG. 3 following the formation of a bit line mask 50 on the top oxide layer 48. The bit line mask 50, formed of photoresist, for example, defines openings 52 that correspond to locations where the buried bit lines are desired.

An ion implantation process is performed, in accordance with the bit line mask 50, to implant ions through the openings 52 into the substrate 40. The dopants that are implanted may be arsenic, for example. A dosage of about between 0.5 to about 3.0 e15 ions/cm$^2$ may be used, with an implantation energy between about 40 and about 80 keV. Other dosages and energies may be used without departing from the scope of the present invention.

Figure 1:
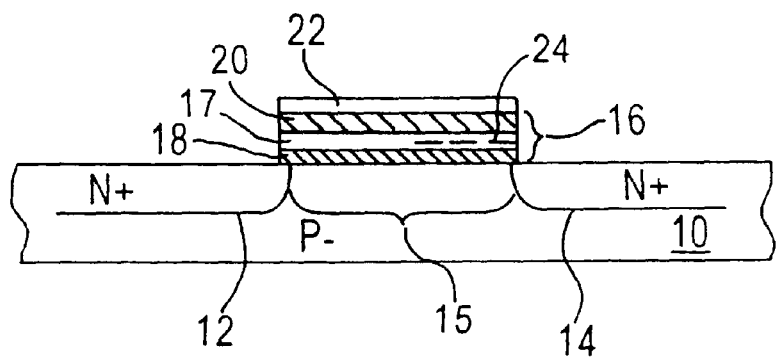
FIG. 1 is a side view of a schematic depiction of a MONOS cell in accordance with the prior art.
Figure 2:
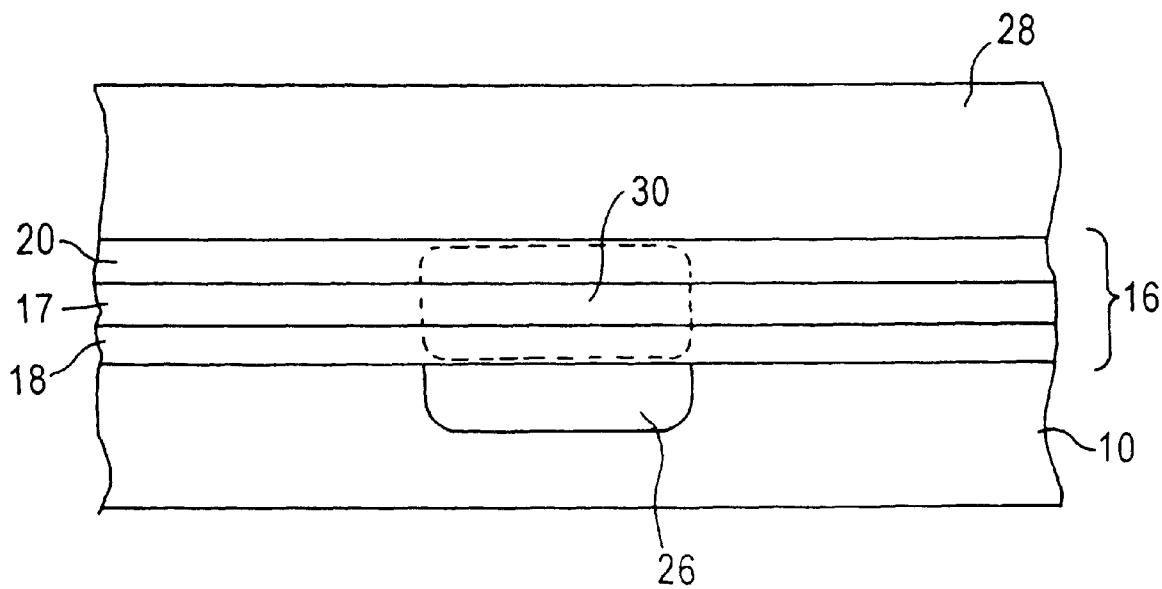
FIG. 2 depicts a step in the formation of a MONOS cell with a damaged area caused by an arsenic bit line implant during formation of a buried bit line, in accordance with the prior art.

The implantation of the arsenic forms a bit line 56 beneath ONO layer 42. Hence, the bit line 56 may be considered a buried bit line. However, during the implantation process, the ONO layer 42 is damaged, thereby creating a damaged region 58. As discussed earlier with respect to prior art FIG. 2, an ONO damaged region between the bit line and a control gate causes leakage between the bit line and the control gate (word line). Unfortunately, removing the damage by conventional techniques using rapid thermal anneals requires precleaning to remove the damaged ONO and also, thermal cycles that undesirably drive the arsenic bit line implant.

Figure 5:
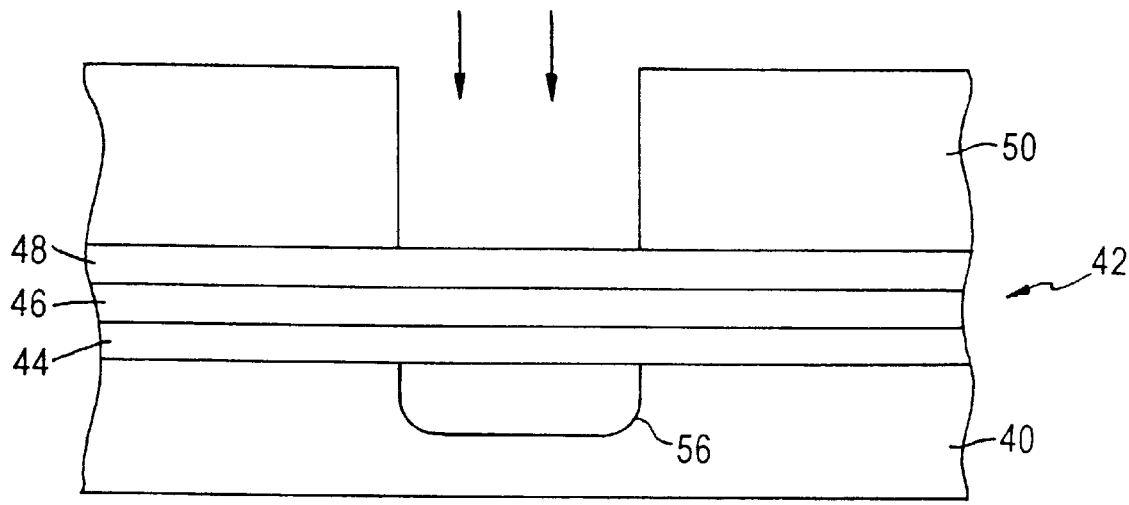
FIG. 5 depicts the structure of FIG. 4 during a laser thermal annealing process that repairs the damage to the ONO layer caused during the bit line implantation, in accordance with embodiments of the present invention.
Figure 6:
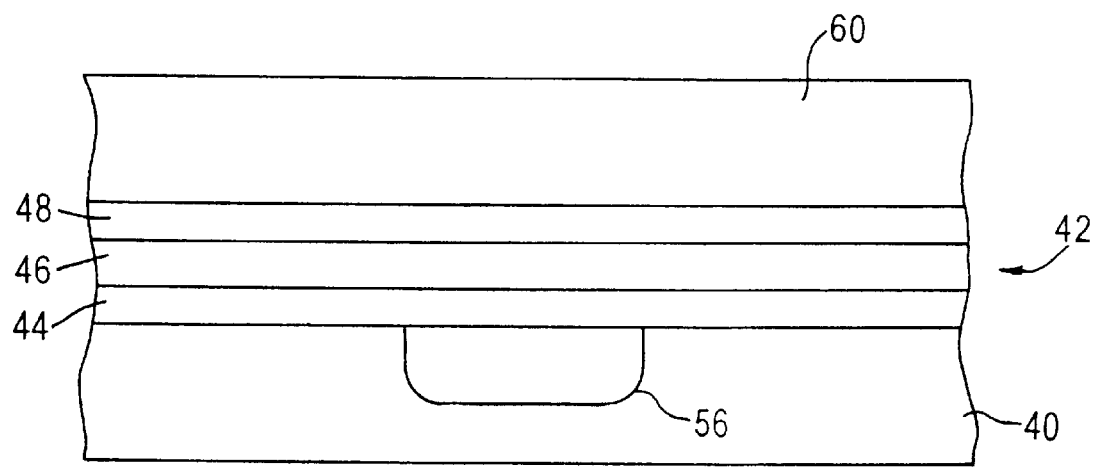
FIG. 6 shows the structure of FIG. 5 after the bit line mask has been removed following laser thermal annealing, and after a control gate layer has been formed over the ONO layer, in accordance with embodiments of the present invention.

To overcome these problems, and to repair the damaged region 58 in a satisfactory manner, the present invention performs a laser thermal annealing process, as indicated by the arrows in FIG. 5. The laser thermal annealing provides precise and directed laser energy at the damaged region 58 of the ONO layer 42. Since laser thermal annealing is used, undesirable driving of the arsenic bit line implant 56 is avoided. As indicated in FIG. 5, the bit line mask 50 may be left in place on the ONO layer 42 during the laser thermal annealing process. In another embodiment, the bit line mask 50 is removed prior to the ONO layer prepared by laser thermal annealing.

The energy fluence of the laser is determined by one of ordinary skill in the art so as to repair the damage to the ONO layer 42, but not undesirably drive the arsenic bit line implant 26. The energy fluence will be dependent upon the thickness of the ONO layer 42. In certain embodiments of the invention, the fluence range, as an example, may be between about 50 mJ/cm$^2$ to about 1.3 J/cm$^2$. A 308 nm excimer laser at 9 Hz repetition may be employed, as an example. Other frequencies, such as between 248 nm to about 450 nm may be employed without departing from the scope of the invention.

Once the laser thermal annealing process has been completed and the bit line mask 50 has been removed (either before or after the laser thermal annealing), a control gate layer may be deposited and patterned in accordance with a desired pattern to form a control gate 60. The control gate 60, made of polysilicon, for example, overlies ONO layer 42.

Since the previously damaged region 58 in the ONO layer 42 has been repaired by the laser thermal annealing process, there is no implant damage remaining between the bit line implant 56 and the control gate 60. Hence, leakage between the buried bit line 56 and the control gate 60 is avoided, and the bit line implant 56 has not been undesirably driven. Further, a precleaning step has also been avoided, thereby preventing any increase in manufacturing cost caused by the addition of an extra step in the manufacturing process.

Another advantage of the present invention is the improved quality of the top oxide layer 48 created by the laser thermal annealing repair. This allows the thickness of this top oxide layer 48 to be reduced in comparison to the prior art ONO layers. When voltage is applied to the gate for programming or reading, electrons stored in the nitride are lost through the top oxide layer. Creating a higher quality top oxide layer 48 allows a thinner layer and consequently, gate voltages to be lowered, or faster read, program and erase with current gate voltages. As exemplary thickness, the thickness of the top oxide layer 48 can be made to be between about 30 to about 80 Angstroms.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming a metal oxide nitride oxide (MONOS) device, comprising the steps of:
    forming a charge trapping dielectric layer on a substrate;
    implanting dopants into the substrate to form a bit line in the substrate;
    laser thermal annealing the charge trapping dielectric layer over the bit line; and
    forming a control gate over the charge trapping dielectric layer.

2. The method of claim 1, wherein the laser thermal annealing is performed with an energy fluence of between about 50 mJ/cm$^2$ to about 1.3 J/cm$^2$.

3. The method of claim 2, wherein the dopants include arsenic (As).

4. The method of claim 3, wherein the step of implanting dopants includes implanting As with a dosage of 0.5 59 3.0 e 15 ions/cm$^2$ with an implantation energy between about 40 and about 80 keV.

5. The method of claim 4, further comprising forming a bit line mask on the charge trapping dielectric layer prior to implanting dopants into the substrate.

6. The method of claim 5, wherein the bit line mask remains on the charge trapping dielectric layer until after the laser thermal annealing is complete.

7. The method of claim 1, wherein the charge trapping dielectric layer is an oxide nitride oxide (ONO) layer.

8. A method of creating a semiconductor device with a buried bit line, comprising the steps of:
    forming a charge trapping dielectric layer on a substrate;
    forming a buried bit line by implanting dopants through the charge trapping dielectric layer into the substrate, thereby damaging the charge trapping dielectric layer; and repairing the damage to the charge trapping dielectric layer by laser thermal annealing the charge trapping dielectric layer.

9. The method of claim 8, wherein the step of repairing the damage includes applying laser energy with a fluence range of between about 50 mJ/cm$^2$ to about 1.3 J/cm$^2$.

10. The method of claim 9, wherein the step of repairing the damage includes applying laser energy from a laser with a wavelength of between about 248 nm to about 450 nm.

11. The method of claim 10, wherein the wavelength is 308 nm.

12. The method of claim 11, wherein the dopant is arsenic.

13. The method of claim 12, wherein the step of implanting dopants includes implanting as with a dosage of between about 0.5 to 3.0 e 15 ions/cm$^2$ with an implantation energy between about 40 and about 80 keV.

14. The method of claim 13, further comprising forming a control gate over the charge trapping dielectric layer after the damage to the charge trapping dielectric layer has been repaired by the laser thermal annealing.

15. The method of claim 8, wherein the charge trapping dielectric layer is an oxide nitride oxide (ONO) layer.

* * * * *